(12) United States Patent
Du

(10) Patent No.: US 12,154,977 B2
(45) Date of Patent: Nov. 26, 2024

(54) CELL STRUCTURE AND ITS RELATED SEMICONDUCTOR DEVICE

(71) Applicant: NANJING SINNOPOWER TECHNOLOGY CO., LTD., Jiangsu (CN)

(72) Inventor: Wenfang Du, Jiangsu (CN)

(73) Assignee: NANJING SINNOPOWER TECHNOLOGY CO., LTD., Jiangsu (CN)

( * ) Notice: Subject to any disclaimer, the term of this patent is extended or adjusted under 35 U.S.C. 154(b) by 596 days.

(21) Appl. No.: 17/604,269

(22) PCT Filed: Aug. 28, 2019

(86) PCT No.: PCT/CN2019/103082
§ 371 (c)(1),
(2) Date: Mar. 29, 2022

(87) PCT Pub. No.: WO2020/211246
PCT Pub. Date: Oct. 22, 2020

(65) Prior Publication Data
US 2022/0367692 A1    Nov. 17, 2022

(30) Foreign Application Priority Data

Apr. 17, 2019 (CN) .................. 201910309976.X

(51) Int. Cl.
*H01L 29/749* (2006.01)
*H01L 29/06* (2006.01)
(Continued)

(52) U.S. Cl.
CPC ........ *H01L 29/749* (2013.01); *H01L 29/0696* (2013.01); *H01L 29/7397* (2013.01); *H01L 29/7455* (2013.01)

(58) Field of Classification Search
CPC ............... H01L 29/749; H01L 29/0696; H01L 29/7397; H01L 29/7455; H01L 29/0623;
(Continued)

(56) References Cited

U.S. PATENT DOCUMENTS 9,048,215 B2    6/2015  Asahara
2004/0084722 A1*  5/2004  Yamaguchi ....... H01L 29/66348
                                                    257/E21.384
(Continued)

FOREIGN PATENT DOCUMENTS

CN    101853850 A    10/2010
CN    105590959 A    5/2016
(Continued)

OTHER PUBLICATIONS

M. Kitagawa, et.al, "A 4500 V injection enhanced insulated gate bipolar transistor (IEGT) operating in a mode similar to a thyristor," Proceedings of IEEE International Electron Devices Meeting, Washington, DC, USA, 1993, pp. 679-682, doi: 10.1109/IEDM.1993.347 (Year: 1993).*

*Primary Examiner* — Joe Schoenholtz
(74) *Attorney, Agent, or Firm* — MUNCY, GEISSLER, OLDS & LOWE, P.C.

(57) ABSTRACT

A cell structure and related semiconductor device. The cell structure includes a semiconductor substrate, which includes a plurality of first and second trench units. A carrier barrier region and an electric field shielding region corresponding to the first and second trench units are provided at a bottom of each trench. Conductive materials are provided in the trenches to correspondingly form two gate regions. A source-body region is provided between adjacent first trench units and in contact with a first metal layer on a top portion of the semiconductor substrate. A floating region is provided between the first and second trench units and is isolated from a second metal layer by an insulating dielectric. More than
(Continued)

one source region is provided in the surface of the source-body region close to a side edge of at least one of the first trench units and the second trench units.

17 Claims, 17 Drawing Sheets

(51) Int. Cl.
*H01L 29/739* (2006.01)
*H01L 29/745* (2006.01)

(58) Field of Classification Search
CPC ............... H01L 29/407; H01L 29/0619; H01L 29/0834; H01L 29/0692
See application file for complete search history.

(56) References Cited

U.S. PATENT DOCUMENTS

| | | | |
|---|---|---|---|
| 2011/0215399 A1 | 9/2011 | Matsuura | |
| 2016/0268421 A1 | 9/2016 | Shinohara | |
| 2017/0250173 A1* | 8/2017 | Yilmaz | ............... H01L 29/0623 |
| 2020/0006539 A1* | 1/2020 | Philippou | ............ H01L 29/0619 |
| 2020/0227527 A1* | 7/2020 | Lyu | ....................... H01L 29/861 |

FOREIGN PATENT DOCUMENTS

| | | |
|---|---|---|
| CN | 106997899 A | 8/2017 |
| CN | 109427869 A | 3/2019 |

\* cited by examiner

CELL STRUCTURE AND ITS RELATED SEMICONDUCTOR DEVICE

BACKGROUND

Technical Field

The present invention relates to the field of semiconductor technologies, and in particular, to a cell structure and its related semiconductor device.

Related Art

Trench power semiconductor devices feature high integration, high input impedance, low drive power, simple drive circuits, low on-resistance, low turn-on voltage drops, high switching speeds, low switching losses, and other advantages, and are widely applied to various power management and switch conversion. For example, a common insulated gate bipolar transistor (IGBT), a full-control voltage-driven composite power semiconductor device including an Metal-Oxide-Semiconductor (MOS) field effect transistor and a bipolar junction transistor (BJT), has the characteristics above. To further improve the robustness and current density of the device, a novel device using a combination of deep and shallow trenches is provided. However, in a manufacturing process of such a power semiconductor device, the doping concentration of different regions need to be adjusted strictly, to effectively control the performance of device. Therefore, the process requirements are relatively strict.

Technical Problem

If the doping accuracy of materials is low, a doped region under a shallow trench reaches a periphery of a deep trench through diffusion. Besides a lateral diffusion, there is a vertical longitudinal. Therefore, the risk of mutual compensation with other semiconductor regions with opposite conductive properties is likely to arise, causing the semiconductor device to lose the gate control performance. Moreover, when there is a shift for the trench etching window during the process, the concentration of a semiconductor region close to the deep trench deviates from a predetermined requirement, resulting in a mismatch with the deep trench. As a result, a relatively poor conduction path or an unexpected hole channel is generated, greatly increasing a turn-on voltage drop of the device.

SUMMARY

Technical Solution

To resolve the foregoing technical problem, an objective of this application is to provide a cell structure and its related semiconductor device, to control the offset tolerance of a trench etching window through improvement of the cell structure.

The objective of this application and resolution to the technical problem are achieved by using the following technical solutions.

This application provides a cell structure of a semiconductor device, comprising: a semiconductor substrate of a first conductivity type; a plurality of trench units, arranged in the semiconductor substrate at a first side, where the plurality of trench units comprise at least two first trench units and at least one second trench unit, and the first trench units are arranged separately, and the at least one second trench unit are disposed on two outer sides of the first trench unit; a first gate region, arranged in the first trench unit and isolated from the semiconductor substrate by a first dielectric; a second gate region, arranged in the second trench unit and isolated from the semiconductor substrate by a second dielectric; a carrier barrier region of the first conductivity type, arranged adjacent to a bottom portion of the first trench unit; an electric field shielding region of a second conductivity type, arranged adjacent to the bottom portion of the second trench unit; a source-body region of the second conductivity type, arranged between the at least two first trench units, where the source-body region comprises more than one source region of the first conductivity type, the source region is in contact with the first dielectric of the first trench unit, and the source-body region and the source region are located in the surface region of the semiconductor substrate at the first side; a floating region, arranged between the first trench unit and the second trench unit; a first metal layer, disposed on a top portion of the semiconductor substrate at the first side, where the first metal layer is in contact with the source-body region, and isolated from the floating region and some or all of the first trench units by a third dielectric; a first semiconductor region, implemented in the semiconductor substrate at a second side, where the second side is opposite to the first side; and a second metal layer, disposed on a surface of the semiconductor substrate at the second side and in contact with the first semiconductor region.

This application may further resolve the technical problem thereof through the following technical means.

In an embodiment of this application, there is at least one another floating region adjacent to one of the second trench units at a side far away from the first trench unit, and is isolated from the first metal layer by the third dielectric.

In an embodiment of this application, a surface of the second gate region is in entire contact with the first metal layer.

In an embodiment of this application, the third dielectric comprises a contact at a notch of the second trench unit, and the first metal layer is in contact with the second gate region through the contact.

In an embodiment of this application, notch widths of the first trench unit and the second trench unit are the same or different.

In an embodiment of this application, a depth of the second trench unit is greater than or equal to a depth of the first trench unit.

In an embodiment of this application, a plurality of second trench units are provided on an outer side of the first trench unit, and the electric field shielding region of the second conductivity type is provided adjacent to bottom of each of the second trench units.

In an embodiment of this application, more than one third trench unit is provided between the plurality of second trench units, a structure of the third trench unit is the same with a structure of the first trench unit, and the first gate region of at least one of the third trench units is connected to the first metal layer.

In an embodiment of this application, the carrier barrier region of the first conductivity type is provided at a bottom of the third trench unit, and the carrier barrier region of the first conductivity type is in contact with the second dielectric of the adjacent second trench unit.

In an embodiment of this application, at least two of the electric field shielding regions are adjacent to each other.

In an embodiment of this application, the source-body region is further arranged between the second trench units and in contact with the first metal layer.

In an embodiment of this application, a second semiconductor region of the first conductivity type is further provided between the second trench units and adjacent to the source-body region, and doping concentrations of the second semiconductor region and the semiconductor substrate are different or the same.

In an embodiment of this application, the source region is of the first conductivity type or the second conductivity type.

In an embodiment of this application, the source region is a heavily doped region or a lightly doped region.

In an embodiment of this application, the first conductivity type is N type, and the second conductivity type is P type.

In an embodiment of this application, the first conductivity type is P type, and the second conductivity type is N type.

In an embodiment of this application, the source region is used as an electron source region when being of the N type, and used as a hole source region when being of the P type.

In an embodiment of this application, the first semiconductor region is of the first conductivity type or the second conductivity type.

In an embodiment of this application, a third semiconductor region of a conductivity type the same as or different from the conductivity type of the first semiconductor region is provided on a side of the first semiconductor region.

In an embodiment of this application, a fourth semiconductor region of a conductivity type different from a conductivity type of the first semiconductor region is provided on a side edge of the first semiconductor region at the same layer.

In an embodiment of this application, the floating region is a semiconductor of the first conductivity type, a semiconductor of the second conductivity type, or an insulating substance.

In an embodiment of this application, the gate region and a cathode region are conductive materials, comprising polysilicon or a conductive metal material.

In an embodiment of this application, the foregoing various semiconductor materials comprise Si materials or SiC materials.

In an embodiment of this application, the first dielectric, the second dielectric, and the third dielectric are optionally an insulating material such as silicon dioxide, benzocyclobutene (BCB), polyimide (PI), or a composite layer of silicon dioxide and another substance such as a composite layer of silicon dioxide and silicon nitride or a composite layer of silicon dioxide and PI.

Another objective of this application is to provide a semiconductor device, comprising a cell region and a terminal region, where the cell region comprises more than one cell, and a structure of the cell comprises: an N-type semiconductor substrate; a plurality of trench units, arranged in the N-type semiconductor substrate at a first side, where the plurality of trench units are filled with polysilicon, and the plurality of trench units comprise first trench units and second trench units, where the first trench units are arranged separately, and the second trench units are disposed on two outer sides of the first trench unit, the polysilicon in the first trench unit serves as a first gate region and isolated from the semiconductor substrate by a first dielectric, and the polysilicon in the second trench unit serves as a second gate region and isolated from the semiconductor substrate by a second dielectric; an N-type carrier barrier region, arranged adjacent to a bottom of the first trench unit; a P-type electric field shielding region, arranged adjacent to a bottom of the second trench unit; a P-type source-body region, arranged between the first trench units, where the P-type source-body region comprises more than one N-type source region, the N-type source region is in contact with the first dielectric of the first trench unit, and the P-type source-body region and the N-type source region are located in a surface of the semiconductor substrate at the first side; a floating region, arranged between the first trench unit and the second trench unit; a first metal layer, disposed on a top portion of the semiconductor substrate at the first side, where the first metal layer is in contact with the source-body region, and isolated from the floating region and some or all of the first trench units by a third dielectric; a P-type semiconductor region, arranged in the semiconductor substrate at a second side, where the second side is opposite to the first side; and a second metal layer, disposed in contact with the P-type semiconductor region.

Beneficial Effects

In this application, the diffusion range of the doped region at the bottom of the shallow trench is adjusted by using the floating region, to avoid formation of mutual compensation between semiconductor regions with different conductive properties, and stabilize the gate control performance of the semiconductor device after fabrication. Moreover, shallow trenches of a plurality of first trench units are arranged side by side. Even though etching windows of few trenches are offset, the doping concentration of the semiconductor region close to the deep trench is relatively adjustable, to prevent a wrong structure cooperating with the deep trench from generating a relatively poor conduction path or an unexpected hole channel, and causing a greatly increased turn-on voltage drop of the device. Furthermore, the floating region can indirectly define the width of the etching window required in the subsequent process of the source-body region, thereby helping to reduce the complexity of setting the source region.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following descriptions show only some embodiments of this application, and a person skilled in the art may still derive other accompanying drawings from these accompanying drawings without creative efforts.

DETAILED DESCRIPTION

Figure 1:
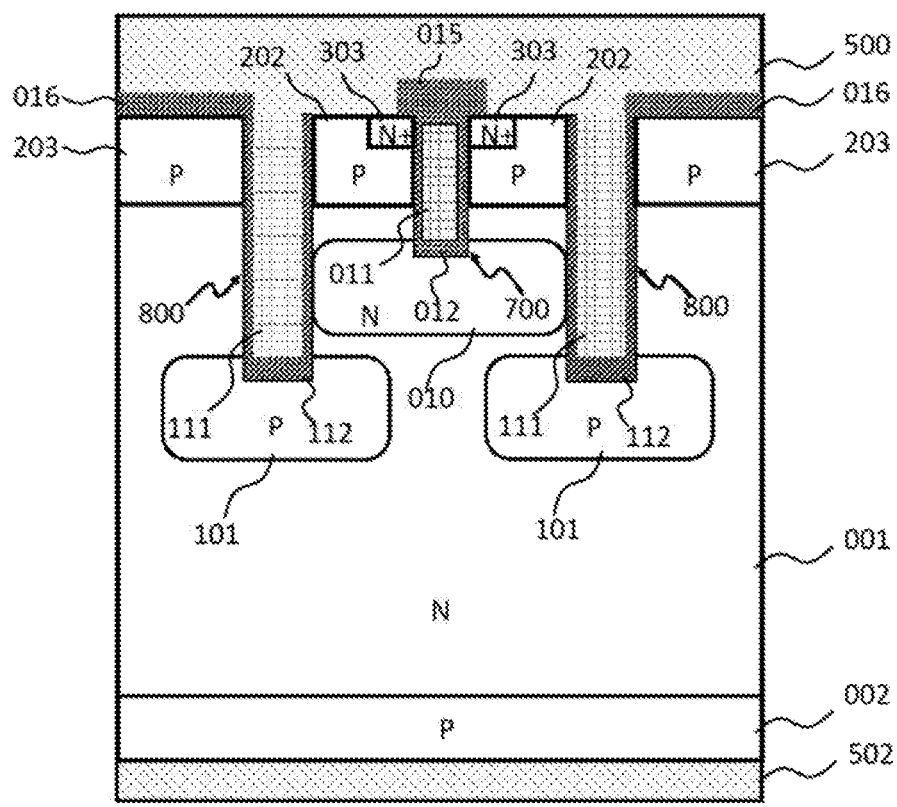
FIG. 1 is an exemplary diagram of a structure of a semiconductor device using a combination of deep and shallow trenches.

Referring to the accompanying drawings, the same component symbols represent the same components. The following descriptions are specific embodiments of this application based on the examples, and are not to be construed as a limitation to other specific embodiments of this application that are not described herein in detail.

The following description of various embodiments is provided to exemplify the specific embodiments of this application with reference to the accompanying drawings. The directional terms mentioned in this application, such as "above", "below", "front", "back", "left", "right", "in", "out", and "side", merely refer to the directions in the accompanying drawings. Therefore, the used directional terms are intended to describe and understand this application, but are not intended to limit this application.

The terms such as "first", "second", and "third" (if any) in the specification and claims of this application and in the accompanying drawings are used for distinguishing similar objects and not necessarily used for describing any particular order or sequence. It should be understood that the objects described in such a way are interchangeable in appropriate circumstances. In addition, the terms "include", "have", and any variant thereof are intended to cover a non-exclusive inclusion.

The terms used in the specification of this application are merely used to describe specific implementations, and are not intended to show the concept of this application. Unless different meanings are indicated clearly in the context, expressions used in the singular form encompass the plural form. In the specification of this application, it should be understood that terms such as "include", "have", and "contain" are intended to indicate the possibility of the features, numbers, steps, actions, or combinations thereof disclosed in the specification of this application, but not to exclude the possibility that one or more other features, numbers, steps, actions or combinations thereof may exist or may be added. The same reference numerals in the accompanying drawings refer to the same parts.

The accompanying drawings and specification are essentially considered as illustrative instead of limitative. In the figures, units with similar structures are represented by using the same reference number. In addition, for understanding and ease of description, the size and thickness of each component shown in the accompanying drawings are arbitrarily shown, but this application is not limited thereto.

In the accompanying drawings, the configuration ranges of devices, systems, components, and circuits are exaggerated for clarity, understanding, and ease of description. It should be understood that, when a component is referred to as being "on" another component, the component may be directly on the other component, or an intermediate component may exist.

In addition, in the specification, unless explicitly described as contrary, the word "include" is understood as including the component, but does not exclude any other components. In addition, in the specification, "above" refers to being located above or below the target component, and does not refer to being located on the top based on the direction of gravity.

To further explain the technical means used in the present invention for achieving the intended objectives and the effects thereof, with reference to the accompanying drawings and specific embodiments, the following describes in detail specific implementations, structures, features, and effects of a cell structure and a semiconductor device using same provided in this application.

FIG. 1 is an exemplary diagram of a structure of a semiconductor device using a combination of deep and shallow trenches. The device includes a plurality of cell units. FIG. 1 illustrates a cross-sectional structural diagram of one of the cells. The structure of the cell includes an N-type semiconductor substrate 001. A P-type first semiconductor region 002 is provided on a side of the N-type semiconductor substrate 001 as an anode region. More than one first trench unit 700 and more than one second trench unit 800 are provided in the other side of the N-type semiconductor substrate 001. A depth of the first trench unit 700 is less than a depth of the second trench unit 800. An N-type carrier barrier region 010 with a doping concentration higher than the doping concentration of the N-type semiconductor substrate 001 is provided at a bottom portion of the first trench unit 700, and is also referred to as a minority carrier barrier region. A P-type electric field shielding region 101 is provided at a bottom portion of the second trench unit 800. The first trench unit 700 and the second trench unit 800 are filled with conductive materials. Such conductive materials may be polysilicon or other materials with conductive properties. The conductive material in the first trench unit 700 is used as a first gate region 011. The conductive material in the second trench unit 800 is used as a second gate region 111. The first gate region 011 and the second gate region 111 are respectively isolated from the N-type semiconductor substrate 001 by a first dielectric 012 and a second dielectric 112. A side edge of the N-type carrier barrier region 010 is in contact with the second dielectric 112 of the second trench unit 800. A P-type source-body region 202 is provided between the first trench unit 700 and the second trench unit 800. An N-type source region 303 is provided in the P-type source-body region 202. The N-type source region 303 is close to the first dielectric 012 on a side of the first trench unit 700. A P-type floating semiconductor region 203 is provided outside the first trench unit 700 and the second trench unit 800. A first electrode 500 and a second electrode 502 include metal materials or are made of metal materials. The first electrode 500 is in contact with at least a part of the first gate region 011, at least a part of the P-type source-body region 202, and at least a part of the N-type source region 303. The second electrode 502 covers the P-type first semiconductor region 002. A third dielectric 015 is disposed between the first gate region 011 and the first electrode 500 for isolation. A fourth dielectric 016 is disposed between the P-type floating semiconductor region 203 and the first electrode 500 for isolation. The first gate region 011 is a gate of the device. The first electrode 500 and the second electrode 502 are respectively a cathode and an anode of the device.

As can be known from above, the first trench unit 700, the N-type carrier barrier region 010, the P-type source-body region 202, and the N-type source region 303 form an N-channel metal-oxide-semiconductor (NMOS) structure. The N-type source region 303 is a source region of electrons of the NMOS. The N-type carrier barrier region 010 is a drain region of the electrons of the NMOS. The first gate region 011 is a gate region of the NMOS. When a voltage $V_{CE}$ between the second electrode 502 and the first electrode 500 is greater than 0, and a voltage $V_{CE}$ between the first gate region 011 and the first electrode 500 is greater than a threshold voltage $V_{THN}$ of the NMOS, a channel of the NMOS is turned on. Electrons pass from the N-type source region 303 through the P-type source-body region 202, the N-type carrier barrier region 010, and the N-type semiconductor substrate 001 and reaches the P-type first semiconductor region 002. Correspondingly, holes pass from the P-type first semiconductor region 002 through the N-type semiconductor substrate 001 and the P-type electric field shielding region 101 and reaches the N-type carrier barrier region 010. A built-in potential formed between the N-type semiconductor substrate 001 and the N-type carrier barrier region 010 blocks the holes from flowing toward the P-type source-body region 202. A hole concentration in the N-type semiconductor substrate 001 significantly increases near the N-type carrier barrier region 010 to form a strong conductivity modulation, thereby greatly increasing the current density of the device. That is, under the same current density, the device has a lower turn-on voltage drop $V_{ON}$ than an IGBT. Through a proper design, under the same turn-on voltage drop, the current density of the device is close to the current density of a thyristor. Therefore, the device is named MOS controlled quasi-thyristor, or MCKT for short.

When the voltage $V_{CE}$ between the second electrode 502 and the first electrode 500 is relatively high, negative ionize acceptors in the partially depleted P-type electric field shielding region 101 absorbs electric field lines generated by positive ionize donors in the depleted N-type semiconductor substrate 001. Therefore, only few electric field lines reach the first gate region 011. Therefore, the electric fields around the dielectric layer at the bottom portions of the first trench unit 700 and the second trench unit 800 are relatively low, so that a high blocking voltage can be obtained while prolonging the lifetime of the dielectric layer, thereby improving the reliability of the device. Since the P-type electric field shielding region 101 shields most of the electric field lines from the N-type semiconductor substrate 001, charges in the first gate region 011 become insensitive to a change of a collector potential, reflected as reduction of the gate-collector capacitance (CGC).

In addition, by adjusting the area ratio of the P-type floating semiconductor region 203 to the cell, a suitable saturated collector current can be obtained, to obtain good short-circuit capability. An ordinary IGBT continues to inject minority carriers to the anode and generates a tail current in a turn-off process thereof. The power loss in the turn-off process is mostly caused by the tail current. In addition, the tail current increases as the efficiency of anode minority carrier injection increases. Since the hole concentration of the MCKT on the side of the N-type carrier barrier region 010 is greatly increased, the efficiency of hole injection at the anode is allowed to be greatly reduced under the same turn-on voltage drop, so that the ratio of an electron current to a total current is increased, and the tail current is reduced. Therefore, a relatively small turn-off loss can be obtained.

Although the device shown in FIG. 1 has the above advantages, the actual process has relatively strict requirements for process control. To effectively block the holes, the N-type carrier barrier region 010 needs to diffuse to and come in contact with a dielectric layer 112 of the second trench unit 800, and the doping concentration of N-type carrier barrier at the surface of the dielectric layer needs to be relatively high. Therefore, the N-type carrier barrier region 010 usually requires a relatively high dose. However, a relatively high dose of the N-type carrier barrier region 010 is likely to diffuse to the P-type source-body region 202 and mutual compensation happens. Consequently, the device loses the gate control capability and fails. In addition, when a trench etching window is shifted compared with the design one during process, the doping concentration of the N-type carrier barrier region 010 at the surface of the dielectric layer 112 on one side is relatively low, providing a channel for the holes to flow out of the device from the P-type source-body region 202 during the on-stage. Consequently, the device loses the advantage of a low turn-on voltage drop.

Figure 2:
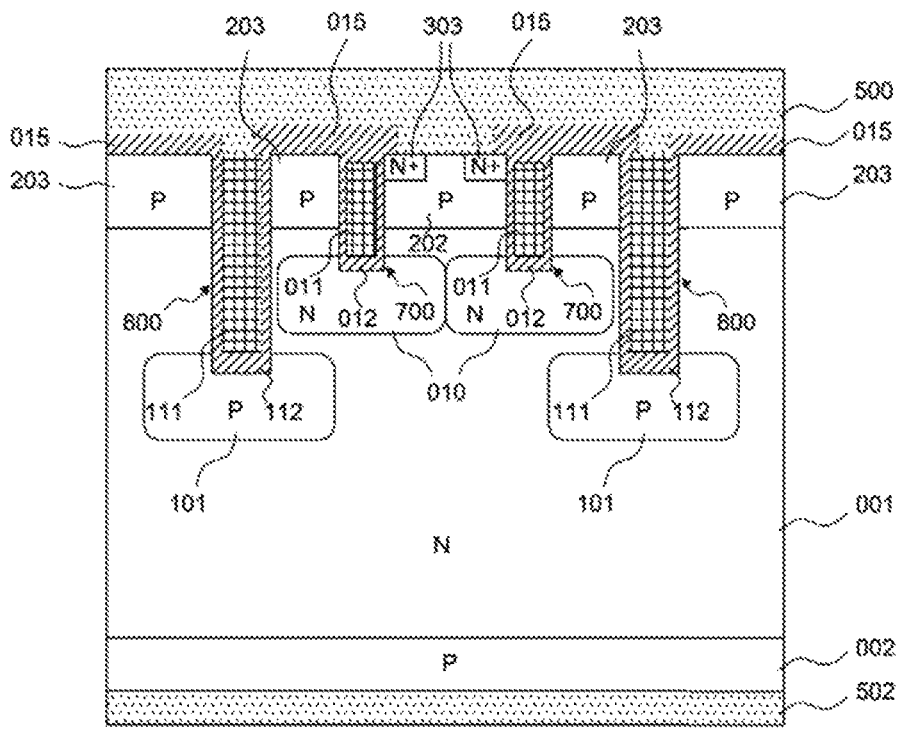
FIG. 2 is a schematic diagram of a cell structure of a semiconductor device according to an embodiment of this application.

FIG. 2 is a schematic diagram of a cell structure of a semiconductor device according to an embodiment of this application. The cell structure includes a semiconductor substrate 001 of a first conductivity type, a plurality of trench units, implemented in the semiconductor substrate 001 at a first side, where the plurality of trench units include first trench units 700 and second trench units 800. The first trench units 700 are arranged separately, and the second trench units 800 are disposed on two outer sides of the first trench units 700. A first gate region 011 is arranged in the first trench unit 700 and isolated from the semiconductor substrate 001 by a first dielectric 012. A second gate region 111 is arranged in the second trench unit 800 and isolated from the semiconductor substrate 001 by a second dielectric 112. A carrier barrier region 010 of the first conductivity type is adjacent to the bottom of the first trench unit 700. An electric field shielding region 101 of a second conductivity type is arranged adjacent to the bottom of the second trench unit 800. A source-body region 202 of the second conductivity type is arranged between two first trench units 700, where the source-body region 202 includes more than one source regions 303. The source region 303 contacts to the first dielectric 012 of the first trench unit 700, and the source-body region 202 and the source region 303 are located in the surface region of the semiconductor substrate 001 at the first side. A floating region 203 is arranged between a first trench unit 700 and a second trench unit 800. A first metal layer is disposed on a top portion of the semiconductor substrate 001, where the first metal layer is in contact with the source-body region 202 and isolated from the floating region 203 and some or all of the first gate regions 011 by a third dielectric 015. And a first semiconductor region 002 is implemented in the semiconductor substrate 001 at a second side, where the second side is opposite to the first side. A second metal layer is disposed at a bottom portion of the semiconductor device. The second metal layer is the second electrode 502 mentioned above, and is used as an anode region in combination with the first semiconductor region 002. The first metal layer is the first electrode 500 mentioned above, and is used as a cathode region relative to the anode region.

For ease of understanding, the conductivity types of semiconductor regions are temporarily the same as the conductivity types in FIG. 1. The first conductivity type is an N type, and the second conductivity type is a P type. In principle, the electrical characteristics of each region presented are the same as the electrical characteristics of the semiconductor device shown in FIG. 1.

The differences between device shown in FIG. 2 and the device shown in FIG. 1 are that in FIG. 2, the source-body region 202 is arranged between two first trench units 700, and there are two floating regions 203. Each floating region 203 is implemented between the first trench unit 700 and the second trench unit 800. The working mechanism of the device is similar to the working mechanism of the device shown in FIG. 1. If the conductivity type of the semiconductor is the same as the conductivity type of the semiconductor in FIG. 1, when a voltage $V_{CE}$ between the second electrode 502 and the first electrode 500 is greater than 0, and a voltage $V_{GE}$ between the first gate region 011 and the first electrode 500 is greater than a threshold voltage $V_{THN}$ of the NMOS consisting of the first trench unit 700, an N-type carrier barrier region 010, a P-type source-body region 202, and an N-type source region 303, the channel of the NMOS is turned on. Electrons pass from the N-type source region 303 through the P-type source-body region 202, the N-type carrier barrier region 010, and the N-type semiconductor substrate 001 and reaches the P-type first semiconductor region 002. Correspondingly, holes pass from the P-type first semiconductor region 002 through the N-type semiconductor substrate 001 and the P-type electric field shielding region 101 and reaches the N-type carrier barrier region. A built-in potential formed between the N-type semiconductor substrate 001 and the N-type carrier barrier region 010 blocks the holes from flowing toward the P-type source-body region 202. In addition, the floating region 203 added also blocks the holes from flowing out of the device. Therefore, the hole concentration near the N-type carrier barrier region 010 significantly increases to form a strong conductivity modulation, thereby greatly increasing the current density of the device. That is, under the same current density, the device has a lower on-state voltage drop $V_{ON}$ than an IGBT. Due to the addition of the floating region 203, the N-type carrier barrier region 010 does not need to diffuse to contact with a dielectric layer 112 of the second trench unit 800. In addition, the doping concentration of the N-type carrier barrier region 010 close to the surface of the dielectric layer is not required to be relatively high. Therefore, the N-type carrier barrier region 010 can be prevented from diffusing to the P-type source-body region 202 for mutual compensation, to stabilize the gate control performance of the semiconductor device after fabrication. Secondly, even though the etching window of the trench (for example, the first trench unit 700) is shifted, no channel for holes is formed between the first trench unit 700 and the second trench unit 800. Therefore, the predetermined functional property of a low on-state voltage drop of the semiconductor device is maintained.

In an embodiment of this application, the floating region 203 is configured to limit the generation positions of hole paths or electron paths. The floating region 203 may be an N-type semiconductor region, or a P-type semiconductor region, or an insulating material, or a conductive material according to design requirements. There are no specific restrictions, provided that the requirements of blocking the hole paths or electron paths can be met.

In an embodiment of this application, notch widths of the first trench unit 700 and the second trench unit 800 are the same or different.

In an embodiment of this application, the depth of the second trench unit 800 is greater than or equal to the depth of the first trench unit 700.

In an embodiment of this application, the third dielectric 015 includes an contact at a position corresponding to a notch of the second trench unit 800, and the first metal layer is in contact with the second gate region 111 through the contact.

In some embodiments, a surface of the second gate region 111 is in entire contact with the first metal layer.

In some embodiments, the opening of the third dielectric 015 is limited. The first metal layer is in contact with a local surface of the second gate region through the opening.

In an embodiment of this application, the conductivity type of source region 303 is of the first conductivity type or the second conductivity type.

In an embodiment of this application, the source region 303 is a heavily doped region or a lightly doped region.

Figure 3:
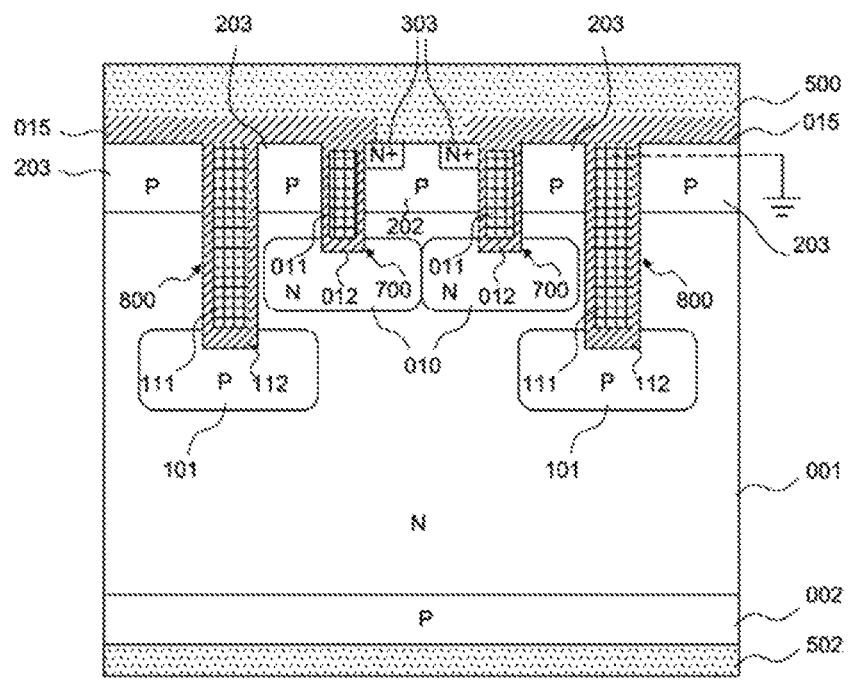
FIG. 3 is a schematic diagram of a cell structure of a semiconductor device according to an embodiment of this application.

FIG. 3 is a schematic diagram of a cell structure of a semiconductor device according to an embodiment of this application. Different from the example in FIG. 2, the notch of the second trench unit 800 is covered by the third dielectric 015. The first metal layer is isolated from the second gate region by the third dielectric.

In some embodiments, the conductive materials in the second trench unit 800 may be designed to have a contact opened in a specific direction, so as to bypass the third dielectric 015 and come into contact with the first metal layer (a first electrode 500), or may have a contact opened in a local region to come in contact with the first metal layer or other grounded parts.

Figure 4:
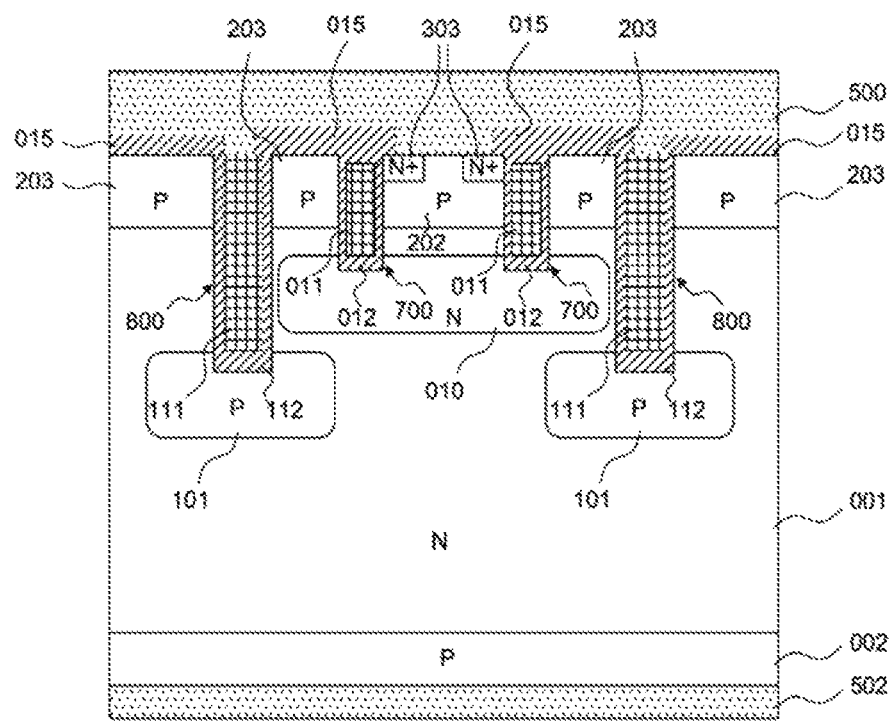
FIG. 4 is a schematic diagram of a cell structure of a semiconductor device according to an embodiment of this application.

FIG. 4 is a schematic diagram of a cell structure of a semiconductor device according to an embodiment of this application. In an embodiment of this application, there is only one carrier barrier region 010, having a relatively wide setting range. The first trench units 700 come into contact with the carrier barrier region 010 at the same time.

Figure 5:
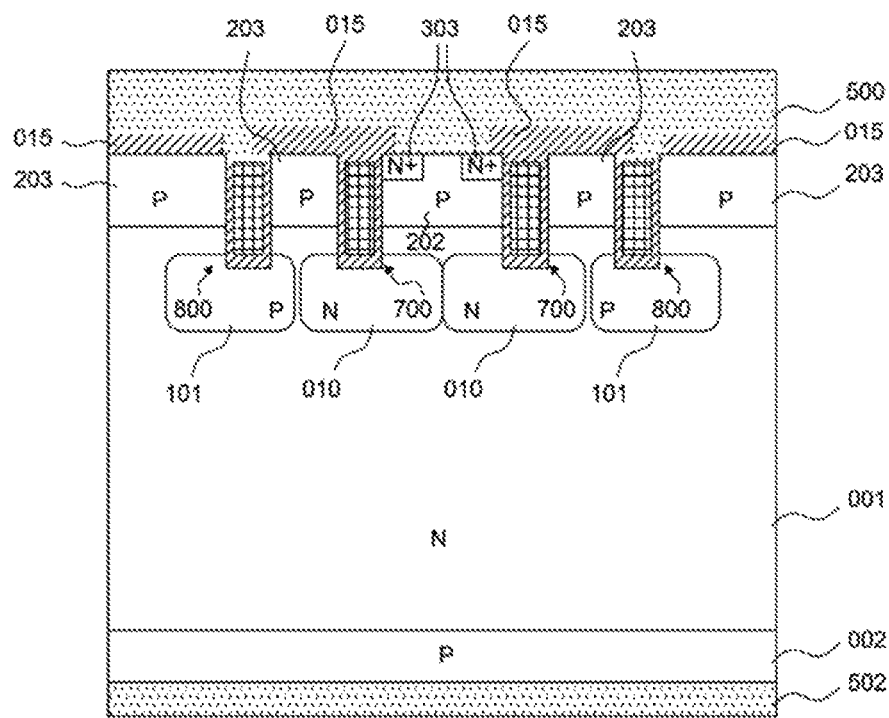
FIG. 5 is a schematic diagram of a cell structure of a semiconductor device according to an embodiment of this application.

FIG. 5 is a schematic diagram of a cell structure of a semiconductor device according to an embodiment of this application. In an embodiment of this application, depths of the first trench unit and the second trench unit are the same or similar. Depths of the electric field shielding region 101 and the carrier barrier region 010 in the semiconductor substrate 001 are also the same or similar. The electric field shielding region 101 and the carrier barrier region 010 adjacent to each other can be optionally designed to be in contact or not in contact with each other.

Figure 6:
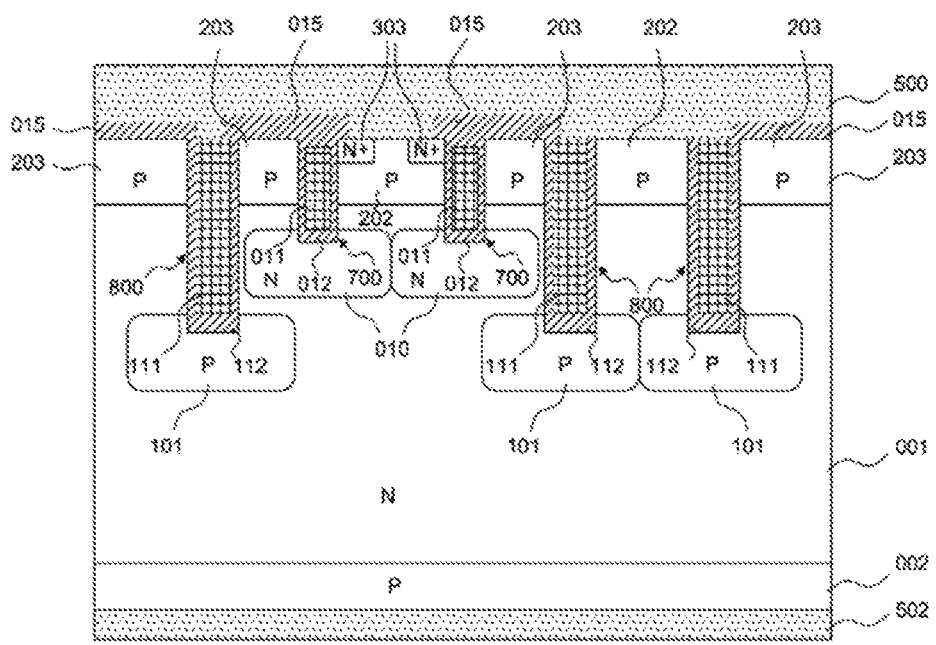
FIG. 6 is a schematic diagram of a cell structure of a semiconductor device according to an embodiment of this application.

FIG. 6 is a schematic diagram of a cell structure of a semiconductor device according to an embodiment of this application. In an embodiment of this application, a plurality of second trench units 800 are provided on an outer side of the first trench unit 700, and the electric field shielding region of the second conductivity type is provided adjacent to bottom portions of all the plurality of second trench units.

In an embodiment of this application, at least two of the electric field shielding regions 101 are adjacent to each other. In an embodiment of this application, another source-body region 202 is arranged between two second trench units 800 and in contact with the first metal layer (the first electrode 500). When the semiconductor device works in specific extreme situations such as high-voltage and high-current state, a large number of positively charged holes are injected from the P-type first semiconductor region 002 into the N-type semiconductor substrate 001 and reach the P-type electric field shielding region 101, to increase a potential of the P-type electric field shielding region 101. When the potential of the P-type electric field shielding region 101 is high to a specific level, a P-channel metal-oxide semiconductor (PMOS) consisting of the P-type source-body region 202, the N-type substrate 001, and the electric field shielding region 101 is turned on. A hole channel separated from an electron channel of the NMOS is formed close to a sidewall of the second trench unit 800. A large number of holes in the N-type semiconductor substrate 001 pass through the P-type source-body region 202 along the hole channel, and finally reach the second electrode 500, the cathode of the MCKT, to avoid the problem of opening of a parasitic transistor including an N-type source region, a P-type source-body region, and an N-type substrate in a conventional device, thereby suppressing the occurrence of latch-up.

Figure 7:
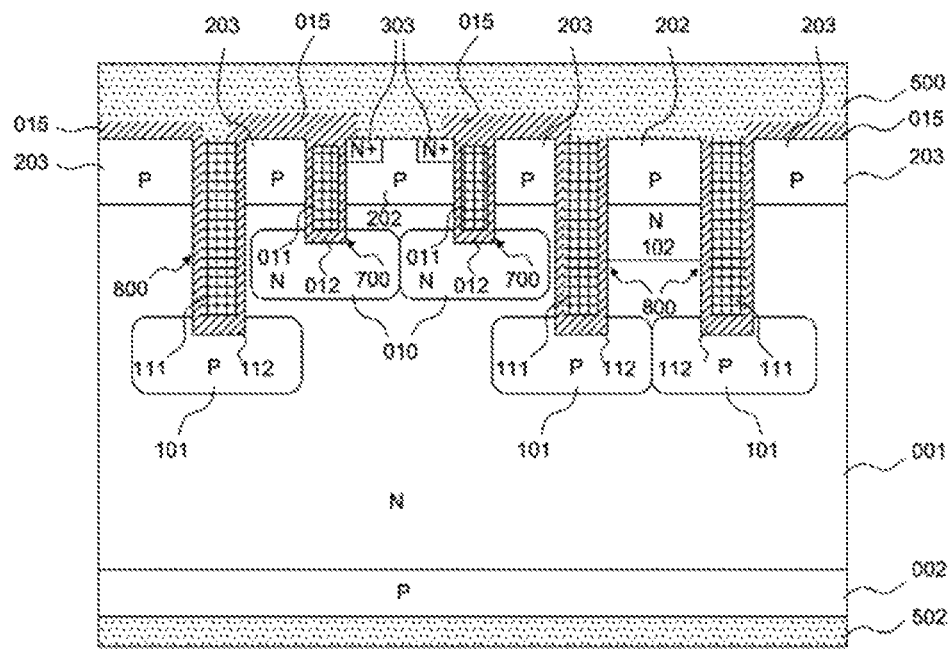
FIG. 7 is a schematic diagram of a cell structure of a semiconductor device according to an embodiment of this application.

FIG. 7 is a schematic diagram of a cell structure of a semiconductor device according to an embodiment of this application. In an embodiment of this application, a second semiconductor region 102 of the first conductivity type having a doping concentration different from a doping concentration of the substrate is provided between the second trench units 800. The second semiconductor region 102 is adjacent to the source-body region 202. The second trench unit 800, the source-body region 202, the second semiconductor region 102, and the electric field shielding region 101 form a PMOS structure. The P-type electric field shielding region 101 is a source region of holes of the PMOS. The P-type source-body region 202 is a drain region of the holes of the PMOS.

In an embodiment of this application, the source-body region 202 is further arranged between the second trench units 800 and in contact with the first metal layer (the first electrode 500).

Figure 8:
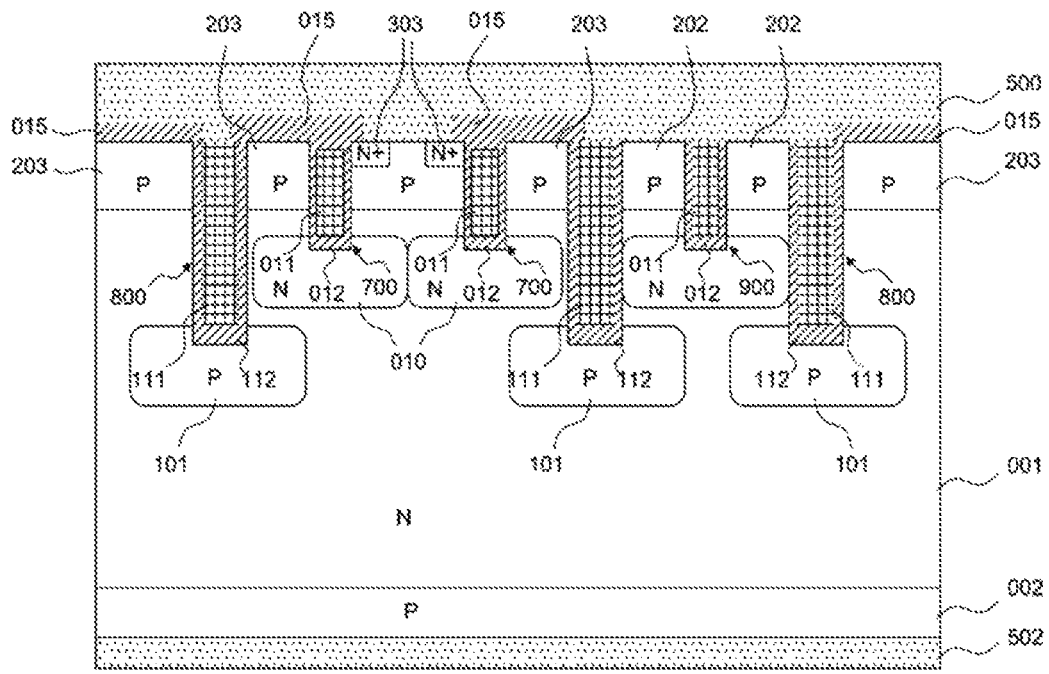
FIG. 8 is a schematic diagram of a cell structure of a semiconductor device according to an embodiment of this application.

FIG. 8 is a schematic diagram of a cell structure of a semiconductor device according to an embodiment of this application. In an embodiment of this application, more than one third trench unit 900 are provided between the plurality of second trench units 800. The structure of the third trench unit 900 is the same with the structure of the first trench unit 700, and a first gate region 011 of at least one of the third trench units 900 is connected to the first metal layer (the first electrode 500).

Figure 9:
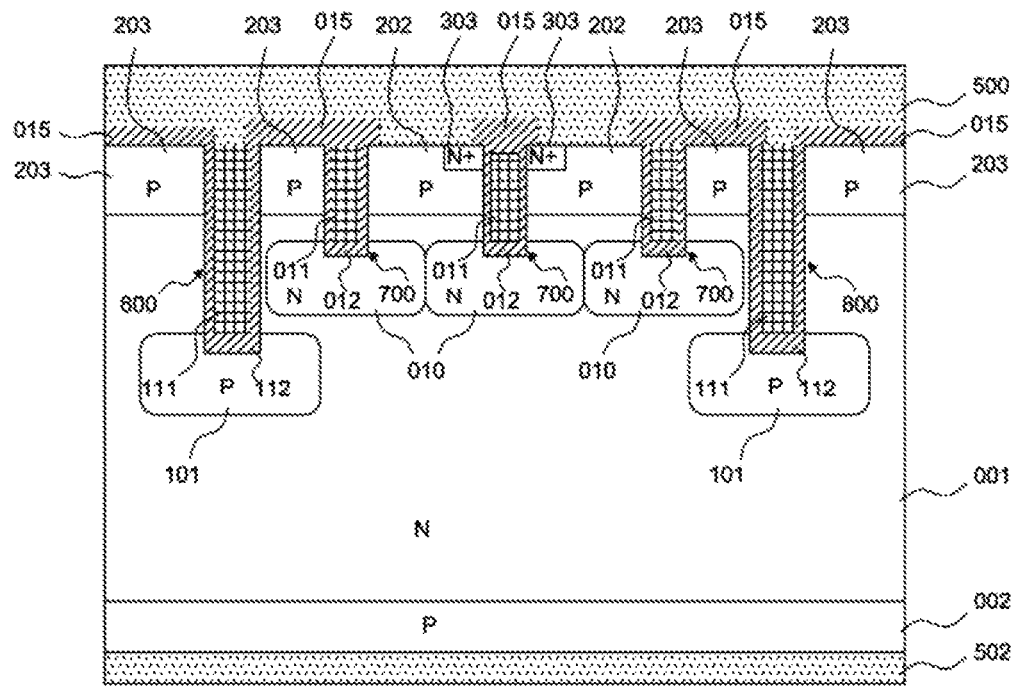
FIG. 9 is a schematic diagram of a cell structure of a semiconductor device according to an embodiment of this application.
Figure 10:
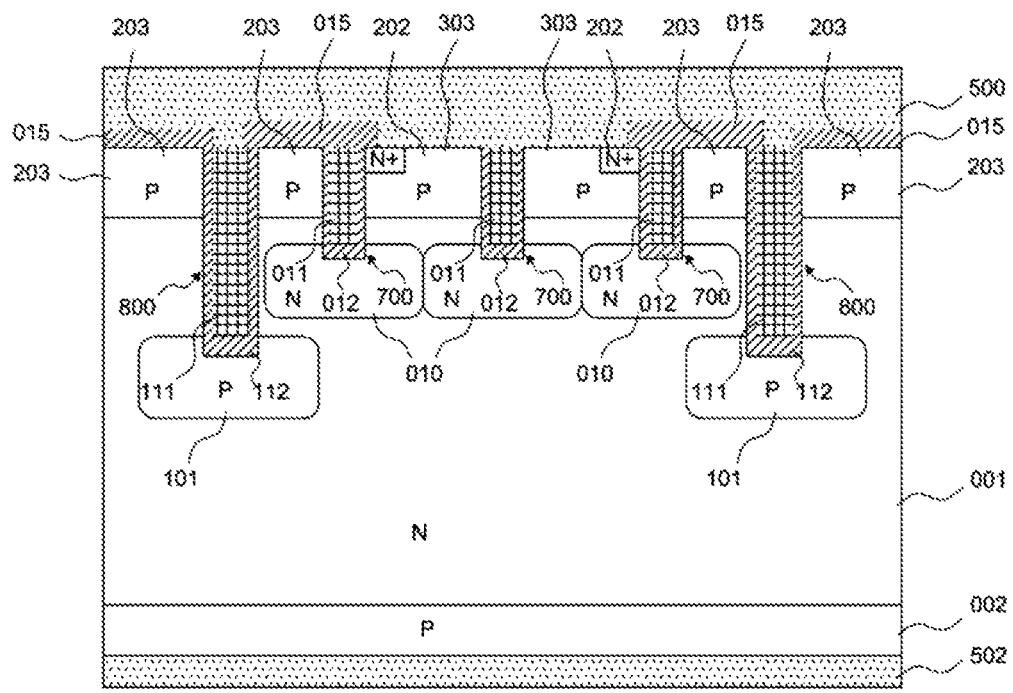
FIG. 10 is a schematic diagram of a cell structure of a semiconductor device according to an embodiment of this application.

FIG. 9 and FIG. 10 are schematic diagrams of a cell structure of a semiconductor device according to an embodiment of this application. In an embodiment of this application, the number of the first trench units 700 is more than three. There is a source-body region 202 is implemented in each region between the first trench units 700. The conductive materials in the first trench units 700 adjacent to the floating region 203 are isolated from the first electrode 500 by the third dielectric 015. The remaining first trench units 700 not adjacent to the floating region are optionally designed to be in contact with the first electrode, or isolated from the first electrode 500 by the third dielectric 015.

In an embodiment of this application, each source-body region 202 includes more than one source region 303. Each source region 303 and the source-body region 202 thereof are both arranged in the surface region of the semiconductor substrate. According to a functional requirement, each source region 303 comes into contact with the first dielectric 011 in the first trench unit 700 corresponding to the functional requirement.

In an embodiment of this application, the source region is used as an electron source region when the conductivity type of the source region is N type, and used as a hole source region when the conductivity type of the source region is P type.

In an embodiment of this application, the first semiconductor region 002 is provided between the semiconductor substrate 001 and the second metal layer.

As stated above, the first semiconductor region 002 is of the second conductivity type, or the conductivity type of the first semiconductor region 002 is the same as the conductivity type of the semiconductor substrate 001.

A third semiconductor region 003 of a conductivity type the same as or different from the conductivity type of the first semiconductor region 002 is provided on a side of the first semiconductor region 002.

In an embodiment of this application, a fourth semiconductor region 004 of a conductivity type different from the conductivity type of the first semiconductor region 002 is provided on a side edge of the first semiconductor region 002 at a same layer.

Figure 11:
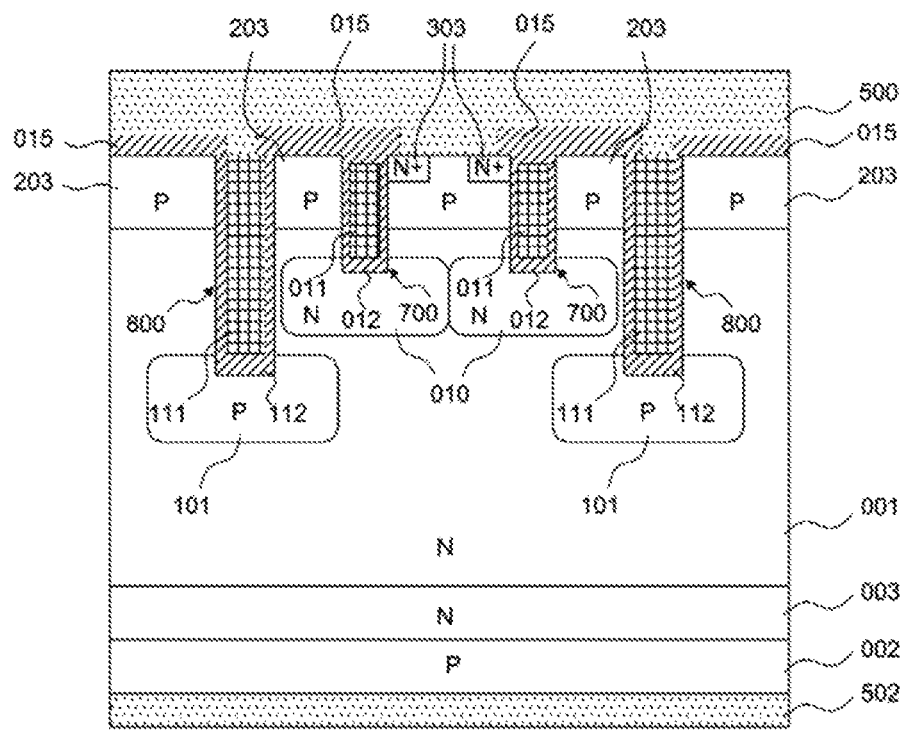
FIG. 11 is a schematic diagram of a punch-through (PT) or field-stop (FS) cell structure according to an embodiment of this application.

FIG. 11 is a schematic diagram of a Punch-Through (PT) cell structure or an Field-Stop (FS) cell structure according to an embodiment of this application. In an embodiment of this application, the third semiconductor region 003 of the first conductivity type is provided on a side of the first semiconductor region 002 as an FS region. The doping concentration of the third semiconductor region 003 is higher than the doping concentration of the semiconductor substrate 001. When the highest voltage is applied between a collector and an emitter, the electric field is stopped in the FS region, and the FS region is not completely depleted. Therefore, an FS structure formed in FIG. 11 can obtain a relatively small thickness of the semiconductor substrate 001, thereby obtaining a lower turn-on voltage drop ($V_{ON}$). Secondly, a total amount of carriers in the semiconductor substrate 001 is proportional to the thickness of the semiconductor substrate 001. Therefore, the total amount of carriers can be reduced. Under a specific current, the time required for the semiconductor device to switch from a turn-on state to a turn-off state or from a turn-off state to a turn-on state is shorter, thereby obtaining smaller switching losses.

Figure 12:
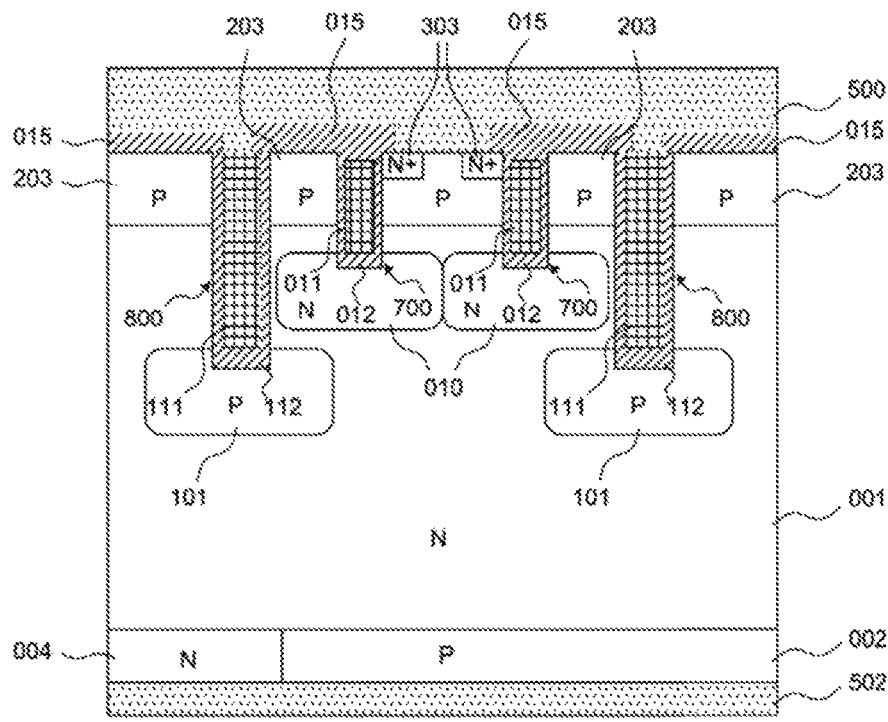
FIG. 12 is a schematic diagram of a reverse conducting (RC) cell structure according to an embodiment of this application.
Figure 13:
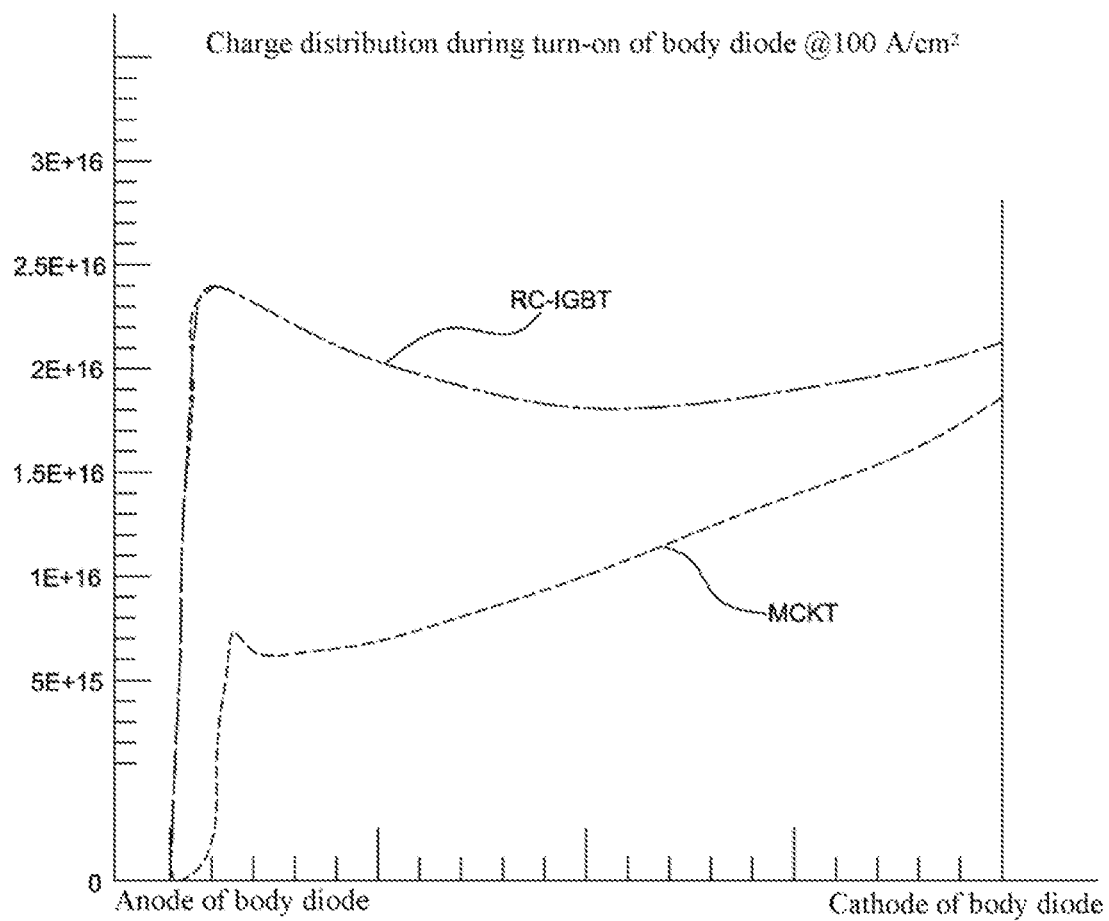
FIG. 13 is a comparison diagram of charge distribution between a MOS controlled quasi-thyristor (MCKT) as an embodiment of this application and an traditional RC-IGBT.

FIG. 12 is a schematic diagram of an RC cell structure according to an embodiment of this application. To facilitate understanding, FIG. 13, a comparison diagram of charge distribution between an MCKT and an RC-IGBT according to an embodiment of this application, is also referred to. The current densities of such two devices are both 100 A/cm$^2$, and the x-axis is the relative distance between the anode and the cathode, depending on the design. In an embodiment of this application, a fourth semiconductor region 004 of the first conductivity type is provided on a side edge of the first semiconductor region 002 at a same layer. Both the first semiconductor region 002 and the fourth semiconductor region 004 are in direct contact with a second electrode 502 to form an anode short structure. Similarly, descriptions are provided with the first conductivity type being an N type and the second conductivity type being a P type. A P-type source-body region 202, an N-type carrier barrier region 010, an N-type semiconductor substrate 001, and an N-type fourth semiconductor region 004 form a body diode. The P-type source-body region 202 is an anode of the body diode. The N-type fourth semiconductor region 004 is a cathode of the body diode. In an embodiment of this application, when the potential of the first electrode 500 is higher than the potential of the second electrode 502, the body diode is forward-biased. A current flows from the P-type source-body region 202 through the N-type carrier barrier region 010 and the N-type semiconductor substrate 001 to the N-type fourth semiconductor region 004. Due to the existence of the N-type carrier barrier region 010, the anode hole injection efficiency of the body diode is greatly reduced. Therefore, an extremely low charge concentration is obtained near an anode region when the body diode is turned on. FIG. 13 shows charge distribution when the body diode of the MCKT according to this application is turned on. Compared with the turn-on situation of a body diode of an RC-IGBT, a charge concentration of the body diode of the RC structure of the MCKT shown in this application on an anode region side thereof is significantly reduced, to obtain a body diode with a characteristic of fast reverse recovery. In addition, for the RC-MCKT device, since the anode short structure is adopted, the anode injection efficiency of the MCKT device is reduced. Therefore, a relatively small turn-off loss can be obtained.

Figure 14:
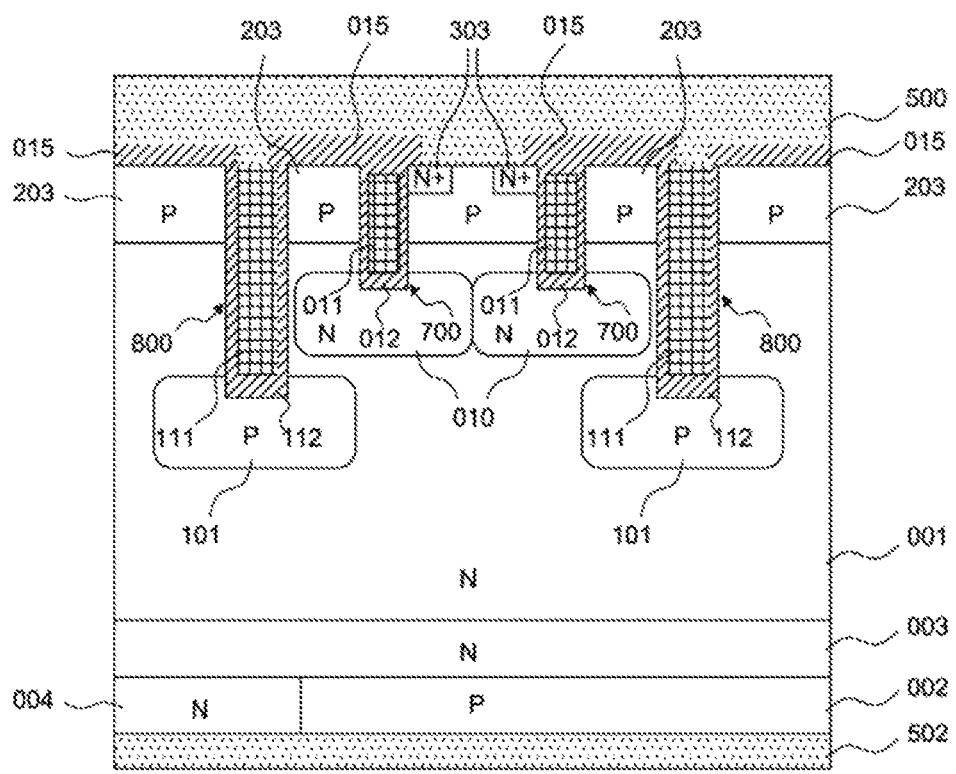
FIG. 14 is a schematic diagram of a cell structure of a combination of a Reverse-conducting and Field-stop structure according to an embodiment of this application.

FIG. 14 is a schematic diagram of a cell structure of a combination of an FS type and an RC type according to an embodiment of this application. The structure shown FIG. 14 has electrical characteristics described in both FIG. 11 and FIG. 12, and details are not described herein again.

In an embodiment of this application, the semiconductor substrate 001 shown in FIG. 1 to FIG. 10 is of a non-PT type. That is, the semiconductor substrate 001 is not completely depleted when a highest voltage is applied between the collector and the emitter. FIG. 11 shows a PT cell or an FS cell. FIG. 12 shows an RC cell. FIG. 14 is a combination of the structures shown in FIG. 11 and FIG. 12. However, the foregoing embodiments are not limited to the respective illustrated structures. The non-PT structure, the PT structure, the FS structure, and the anode short structure, or structures equivalent/similar to the above are applicable to each embodiment.

Figure 15:
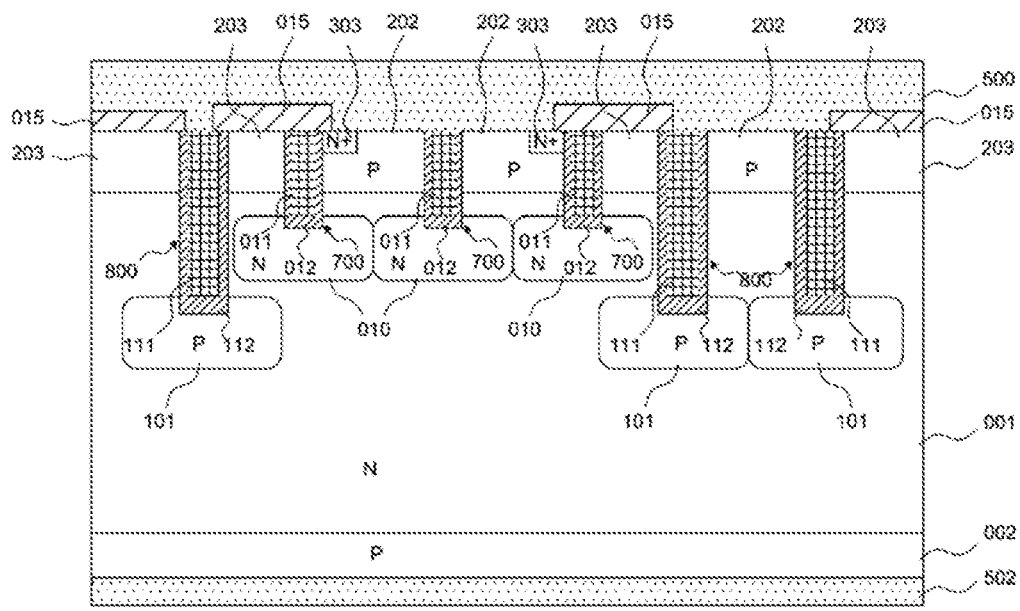
FIG. 15 is a schematic diagram of a cell structure of a semiconductor device according to an embodiment of this application.
Figure 16:
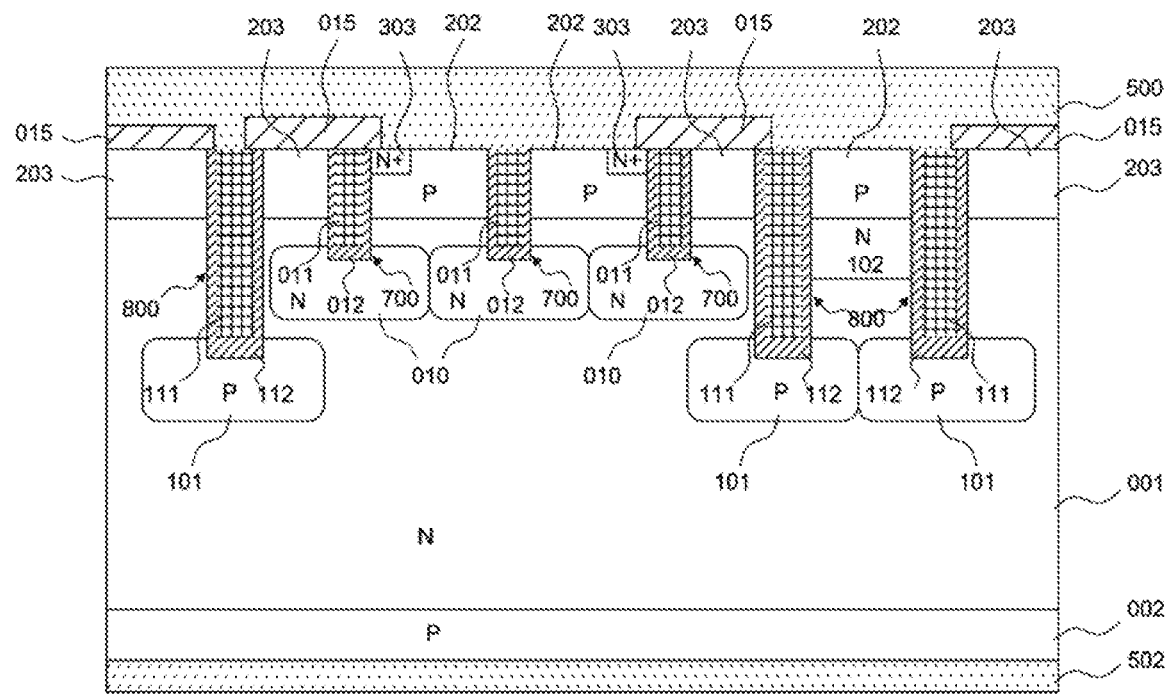
FIG. 16 is a schematic diagram of a cell structure of a semiconductor device according to an embodiment of this application.
Figure 17:
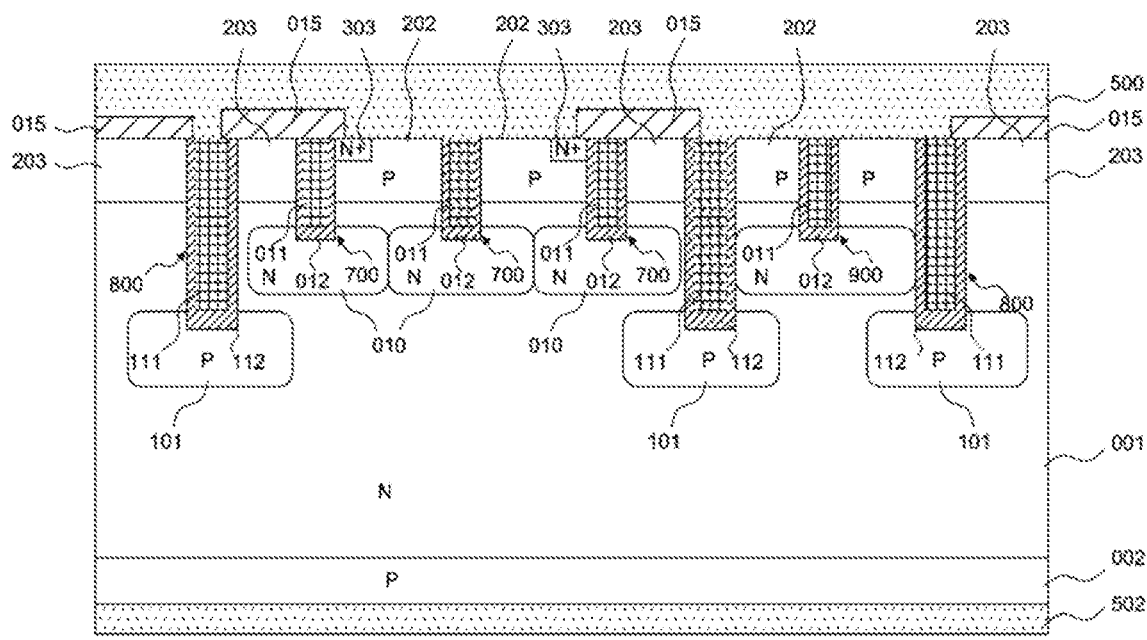
FIG. 17 is a schematic diagram of a cell structure of a semiconductor device according to an embodiment of this application.

In an embodiment of this application, the plurality of adjacent second trench units 800, the third trench units 900, and supporting structure designs thereof shown in FIG. 6 to FIG. 8 are not limited to the examples shown in FIG. 6 to FIG. 8, and structure of various embodiments and examples of this application may alternatively be used, as shown in FIG. 15 to FIG. 17, but are not limited to the examples in the specification. Same, related, similar, and equivalent semiconductor device structures are also applicable.

In an embodiment of this application, the first gate region 011 and the second gate region 111 are filled with conductive material, including polysilicon and/or a conductive metal material.

In an embodiment of this application, the foregoing various semiconductor materials include Si materials and/or SiC materials.

In an embodiment of this application, the first dielectric 012, the second dielectric 112, the third dielectric 015, and the fourth dielectric 016 are optionally an insulating material such as silicon dioxide, BCB, PI, or a composite layer, such as a composite layer of silicon dioxide and silicon nitride or a composite layer of silicon dioxide and PI.

Another objective of this application is to provide a semiconductor device, including a cell region and a terminal region, where the cell region includes more than one cell, and a structure of the cell includes: an N-type semiconductor substrate 001; a plurality of trench units implemented in the N-type semiconductor substrate 001 at a first side, where the plurality of trench units are filled with polysilicon. The plurality of trench units include first trench units 700 and second trench units 800. The first trench units 700 are arranged separately, and the second trench units 800 are disposed on two outer sides of the first trench unit 700. The polysilicon in the first trench unit 700 is as a first gate region 011 and isolated from the semiconductor substrate 001 by a first dielectric 012. The polysilicon in the second trench unit 800 is as a second gate region 111 and isolated from the semiconductor substrate 001 by a second dielectric 112. An N-type carrier barrier region 010 is adjacent to the bottom portion of the first trench unit 700; a P-type electric field shielding region 101 is adjacent to the bottom portion of the second trench unit 800; a P-type source-body region 202 is arranged between the first trench units 700, where the P-type source-body region 202 includes more than one N-type source region 303. The N-type source region 303 contacts to the first dielectric 012 of the first trench unit 700. And the P-type source-body region 202 and the N-type source region 303 are located in the surface region of the semiconductor substrate 001 at the first side. A floating region 203 is arranged between a first trench unit 700 and a second trench unit 800. A first metal layer is disposed on a top portion of the semiconductor substrate 001, where the first metal layer is in contact with the source-body region 202, and isolated from the floating region 203 and some or all of the first trench units 700 by a third dielectric 015. AP-type semiconductor region 002 is arranged on a second side of the semiconductor substrate 001, where the second side is opposite to the first side. And a second metal layer 502 is disposed in contact with the P-type semiconductor region 002.

In this application, the diffusion range of the doped region at the bottom of the shallow trench is adjusted by using the floating region, to avoid formation of mutual compensation between semiconductor regions with different conductive properties, and stabilize the gate control performance of the semiconductor device after fabrication. Secondly, the floating region added in this application prevents holes from flowing out of the body from the doped region. Therefore, the generation of hole channels due to the offset of the trench etching window can be avoided. The trench etching tolerance is increased, and the predetermined functional property of low turn-on voltage drop of the semiconductor device is maintained.

As mentioned above, the first conductivity type is different from the second conductivity type. For example, the first conductivity type is a P type, and the second conductivity type is an N type; or the first conductivity type is an N type, and the second conductivity type is a P type. That is, the N type and P type in the above description are interchangeable. The corresponding electrons and holes are also interchangeable. After the interchange, the principle of the present invention is still applicable.

The terms such as "in an embodiment of this application" and "in various embodiments" are repeatedly used. The terms generally do not refer to the same embodiment, but may alternatively refer to the same embodiment. Terms such as "include", "have", and "include" are synonymous, unless the context indicates other meanings.

The above descriptions are merely specific embodiments of this application, and are not intended to restrict the application in any form. Although this application is described above with reference to the specific embodiments, the embodiments are not intended to limit this application. A person skilled in the art in the art may make some changes or modify the embodiments into equivalent embodiments with equivalent changes by using the disclosed content without departing from the scope of the technical solution of this application. However, any simple modification, equivalent change and modification made to the above embodiments according to the technical essence of the application without departing from the content of the technical solutions of this application shall fall within the scope of the technical solutions of this application.

INDUSTRIAL PRACTICABILITY

The subject matter of this application can be manufactured and used in industry, and is industrially practicable.

What is claimed is:

1. A cell structure of a semiconductor device, comprising:
a semiconductor substrate of a first conductivity type;
  a plurality of trench units, arranged in said semiconductor substrate at a first side, wherein said plurality of trench units comprise at least two first trench units and at least one second trench unit, and said first trench units are arranged separately, and said second trench units are disposed on two outer sides of said first trench unit;
  a first gate region, arranged in said first trench unit and isolated from said semiconductor substrate by a first dielectric;
  a second gate region, arranged in said second trench unit and isolated from said semiconductor substrate by a second dielectric;
  a carrier barrier region of said first conductivity type, arranged adjacent to the bottom portion of said first trench unit;
  an electric field shielding region of a second conductivity type, arranged adjacent to the bottom portion of said second trench unit;
  a source-body region of said second conductivity type, arranged between two said first trench units, wherein said source-body region comprises more than one source region of said first conductivity type, and said source region is in contact with said first dielectric of said first trench unit, and said source-body region and said source region are located in the surface region of said semiconductor substrate at said first side;
  a floating region, arranged between said first trench unit and said second trench unit;
  a first metal layer, disposed on a top portion of said semiconductor substrate at said first side, wherein said first metal layer is in contact with said source-body region, and isolated from said floating region and some or all of said first trench units by a third dielectric;
  a first semiconductor region, implemented in said semiconductor substrate at a second side, wherein said second side is opposite to said first side; and
  a second metal layer, disposed on surface of said semiconductor substrate at said second side and in contact with said first semiconductor region,
  wherein a plurality of said second trench units are provided on an outer side of said first trench unit, and said electric field shielding region of said second conductivity type is provided adjacent to bottom of each of said second trench units,
  wherein more than one third trench unit is provided between said plurality of second trench units, said structure of said third trench unit is the same with said structure of said first trench unit, and said first gate region of at least one of said third trench units is connected to said first metal layer.

2. Said cell structure of said semiconductor device according to claim 1, wherein there is at least one another said floating region adjacent to one of said second trench units at the side far away from said first trench unit, and is isolated from said first metal layer by said third dielectric.

3. Said cell structure of said semiconductor device according to claim 1, wherein a surface of said second gate region is in entire contact with said first metal layer.

4. Said cell structure of said semiconductor device according to claim 1, wherein said third dielectric comprises a contact at a notch of said second trench unit, and said first metal layer is in contact with said second gate region through said contact.

5. Said cell structure of said semiconductor device according to claim 4, wherein notch widths of said first trench unit and said second trench unit are the same or different.

6. Said cell structure of said semiconductor device according to claim 1, wherein the depth of said second trench unit is greater than or equal to the depth of said first trench unit.

7. Said cell structure of said semiconductor device according to claim 1, wherein said carrier barrier region of said first conductivity type is provided at bottom of said third trench unit, and said carrier barrier region of said first conductivity type is in contact with said second dielectric of said adjacent second trench unit.

8. Said cell structure of said semiconductor device according to claim 1, wherein at least two of said electric field shielding regions are adjacent to each other.

9. Said cell structure of said semiconductor device according to claim 1, wherein said source-body region is further arranged between said second trench units and in contact with said first metal layer.

10. Said cell structure of said semiconductor device according to claim 9, wherein a second semiconductor region of said first conductivity type is further provided between said second trench units and adjacent to said source-body region, and doping concentrations of said second semiconductor region and said semiconductor substrate are different or the same.

11. Said cell structure of said semiconductor device according to claim 1, wherein said source region comprises said first conductivity type or said second conductivity type.

12. Said cell structure of said semiconductor device according to claim 1, wherein said source region comprises a heavily doped region or a lightly doped region.

13. Said cell structure of said semiconductor device according to claim 1, wherein said first conductivity type is N type, and said second conductivity type is P type; or said first conductivity type is P type, and said second conductivity type is N type.

14. Said cell structure of said semiconductor device according to claim 1, wherein said first semiconductor region is of comprises said first conductivity type or said second conductivity type.

15. Said cell structure of said semiconductor device according to claim 1, wherein a third semiconductor region comprising a conductivity type the same as or different from said conductivity type of said first semiconductor region is provided on a side of said first semiconductor region.

16. Said cell structure of a semiconductor device according to claim 1, wherein a fourth semiconductor region comprising a conductivity type different from a conductivity type of said first semiconductor region is provided on a side edge of said first semiconductor region at the same layer.

17. Said cell structure of a semiconductor device according to claim 1, wherein said floating region comprises a semiconductor region of said first conductivity type, or a semiconductor region of said second conductivity type, or an insulating substance.

\* \* \* \* \*